United States Patent
Hou

(10) Patent No.: US 11,522,026 B2
(45) Date of Patent: Dec. 6, 2022

(54) DISPLAY SUBSTRATE AND FABRICATION METHOD THEREOF, INK-JET PRINTING METHOD AND DISPLAY DEVICE

(71) Applicant: BOE TECHNOLOGY GROUP CO., LTD., Beijing (CN)

(72) Inventor: Wenjun Hou, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 754 days.

(21) Appl. No.: 16/335,097

(22) PCT Filed: Sep. 17, 2018

(86) PCT No.: PCT/CN2018/106006
§ 371 (c)(1),
(2) Date: Mar. 20, 2019

(87) PCT Pub. No.: WO2019/062580
PCT Pub. Date: Apr. 4, 2019

(65) Prior Publication Data
US 2021/0376016 A1   Dec. 2, 2021

(30) Foreign Application Priority Data

Sep. 28, 2017   (CN) .......................... 201710898569.8

(51) Int. Cl.
*H01L 27/32* (2006.01)
*H01L 51/56* (2006.01)
*H01L 51/00* (2006.01)

(52) U.S. Cl.
CPC ...... *H01L 27/3246* (2013.01); *H01L 27/3283* (2013.01); *H01L 51/56* (2013.01); *H01L 51/0005* (2013.01)

(58) Field of Classification Search
None
See application file for complete search history.

(56) References Cited

U.S. PATENT DOCUMENTS

| 7,795,800 B2 | 9/2010 | Lee et al. |
| 2009/0140647 A1 | 6/2009 | Chung et al. |
| (Continued) | | |

FOREIGN PATENT DOCUMENTS

| CN | 1638553 A | 7/2005 |
| CN | 1943879 A | 4/2007 |
| (Continued) | | |

OTHER PUBLICATIONS

International Search Report of PCT/CN2018/106006 in Chinese, dated Dec. 20, 2018, with English translation.
(Continued)

*Primary Examiner* — Michelle Mandala
(74) *Attorney, Agent, or Firm* — Collard & Roe, P.C.

(57) ABSTRACT

A display substrate and preparation method thereof, an ink-jet printing method and a display device are provided. The display substrate includes a display area, a peripheral area, and a pixel definition layer; the pixel definition layer including: a display pixel definition region and an assistant pixel definition region surrounding the display pixel definition region; the display pixel definition region includes a plurality of first pixel definition units; the assistant pixel definition region includes a plurality of second pixel definition units, and opening areas of the second pixel definition units are respectively greater than those of the first pixel definition units; the display pixel definition region is in the display area, the assistant pixel definition region is in the peripheral area, the plurality of first pixel definition units is configured to form display pixels, and the plurality of second pixel definition units is configured to form assistant pixels.

16 Claims, 3 Drawing Sheets

(56) References Cited

U.S. PATENT DOCUMENTS

2014/0084258 A1    3/2014  Choi
2016/0079323 A1    3/2016  Choi et al.
2018/0033830 A1*  2/2018  Kim .................... G06F 3/0446

FOREIGN PATENT DOCUMENTS

CN        103700684 A    4/2014
CN        207165575 U    3/2018

OTHER PUBLICATIONS

Notice of Transmittal of the International Search Report of PCT/CN2018/106006 in Chinese, dated Dec. 20, 2018.
Written Opinion of the International Searching Authority of PCT/CN2018/106006 in Chinese, dated Dec. 20, 2018 with English translation.
European Search Report in European Patent Application No. 18857407.3 dated May 25, 2021, with English translation.

* cited by examiner

DISPLAY SUBSTRATE AND FABRICATION METHOD THEREOF, INK-JET PRINTING METHOD AND DISPLAY DEVICE

CROSS REFERENCE TO RELATED APPLICATIONS

This application is the National Stage of PCT/CN2018/106006 filed on Sep. 17, 2018, which claims priority under 35 U.S.C. § 119 of Chinese Application No. 201710898569.8 filed on Sep. 28, 2017, the disclosure of which is incorporated by reference.

TECHNICAL FIELD

Embodiments of the present disclosure relate to a display substrate and fabrication method thereof, an ink-jet printing method and a display device

BACKGROUND

Due to its advantages of self illumination, quick response, a wide viewing angle, high brightness, bright color, light weight, or the like, an organic light-emitting display device becomes an important display technology.

An organic functional layer of an organic light-emitting display device is formed by, for example, ink-jet printing which needs to form a pixel definition layer on a base substrate in advance to inject an organic functional material into a specified pixel area accurately.

SUMMARY

At least one embodiment of the present disclosure provides a display substrate, having a display area and a peripheral area, and comprising a pixel definition layer; the pixel definition layer comprises: a display pixel definition region and an assistant pixel definition region surrounding the display pixel definition region, the display pixel definition region comprising a plurality of first pixel definition units, the assistant pixel definition region comprising a plurality of second pixel definition units, opening areas of at least part of the second pixel definition unit being greater than that of first pixel definition units, respectively, the display pixel definition region being in the display area, the assistant pixel definition region being in the peripheral area, the plurality of first pixel definition units being configured to form display pixels, and the plurality of second pixel definition units being configured to form assistant pixels.

For example, in the display substrate provided by at least one embodiment of the present disclosure, the plurality of second pixel definition units is arranged layer by layer surrounding the display pixel definition region, a proximal side of display pixel definition region is an inner side, and the opening areas of the second pixel definition units in the assistant pixel definition region increase gradually from an inner layer to an outer layer.

For example, in the display substrate provided by at least one embodiment of the present disclosure, the openings of the plurality of first pixel definition units have a same area, and the opening areas of the second pixel definition units at the innermost layer are equal to those of the first pixel definition units.

For example, in the display substrate provided by at least one embodiment of the present disclosure, the plurality of first pixel definition units has different opening areas, and the opening areas of the second pixel definition units at the innermost layer are respectively equal to those of the first pixel definition units adjacent thereto.

For example, in the display substrate provided by at least one embodiment of the present disclosure, the assistant pixel definition region comprises 3-6 layers of each second pixel definition units.

For example, in the display substrate provided by at least one embodiment of the present disclosure, the openings of the second pixel definition units 201 located in a same layer and the openings of the first pixel definition units adjacent thereto have the same shape and become larger in a same proportion.

For example, in the display substrate provided by at least one embodiment of the present disclosure, the first pixel definition units and the second pixel definition units are arranged in a matrix.

At least one embodiment of the present disclosure provides an ink-jet printing method using any of the pixel definition layers of the display substrates, comprising: performing ink-jet printing in the openings of the first pixel definition units and the second pixel definition units.

For example, in the ink-jet printing method provided by at least one embodiment of the present disclosure, an ink amount for ink-jet printing in each opening of the second pixel definition units is not less than an ink amount for ink-jet printing in each opening of the first pixel definition units.

For example, in the ink-jet printing method provided by at least one embodiment of the present disclosure, the ink amounts for ink-jet printing in each second pixel definition unit and each first pixel definition unit are in direct proportion to the sizes of the opening areas of the each second pixel definition unit and the each first pixel definition unit.

At least one embodiment of the present disclosure provides a method for preparing a display substrate, the display substrate comprising a display area and a peripheral area, the method comprising: forming a pixel definition layer, the pixel definition layer comprising: a display pixel definition region and an assistant pixel definition region surrounding the display pixel definition region. The display pixel definition region comprises a plurality of first pixel definition units; the assistant pixel definition region comprises a plurality of second pixel definition units, and opening areas of at least part of the second pixel definition units are respectively greater than those of the first pixel definition units; forming the display pixel definition region in the display area, forming the assistant pixel definition region in the peripheral area; forming a plurality of first pixels in the display area by a plurality of first pixel definition units; and forming a plurality of second pixels in the peripheral area by a plurality of second pixel definition units.

For example, in the method for preparing a display substrate provided by at least one embodiment of the present disclosure, forming of the plurality of first pixels and the plurality of second pixels comprises: ink-jet printing organic materials in the openings of the first pixel definition units and the second pixel definition units to form an organic functional layer.

For example, in the method for preparing a display substrate provided by at least one embodiment of the present disclosure, amounts of ink-jet printed organic materials in the openings of the second pixel definition units and the first pixel definition units are in direct proportion to the opening areas of the second pixel definition units and the first pixel definition units, respectively.

For example, in the method for preparing a display substrate provided by at least one embodiment of the present disclosure, the organic functional layer comprises at least one of an organic light-emitting layer, an electron injection layer, a hole injection layer, an electron transfer layer, and a hole transfer layer.

At least one embodiment of the present disclosure provides a display device, comprising any of the display substrates.

BRIEF DESCRIPTION OF THE DRAWINGS

In order to clearly illustrate technical solutions of the embodiments of the disclosure, the drawings of the embodiments will be briefly described in the following. It is apparent that the described drawings are only related to some embodiments of the disclosure and are not limits to the disclosure.

DETAILED DESCRIPTION

Figure 1:
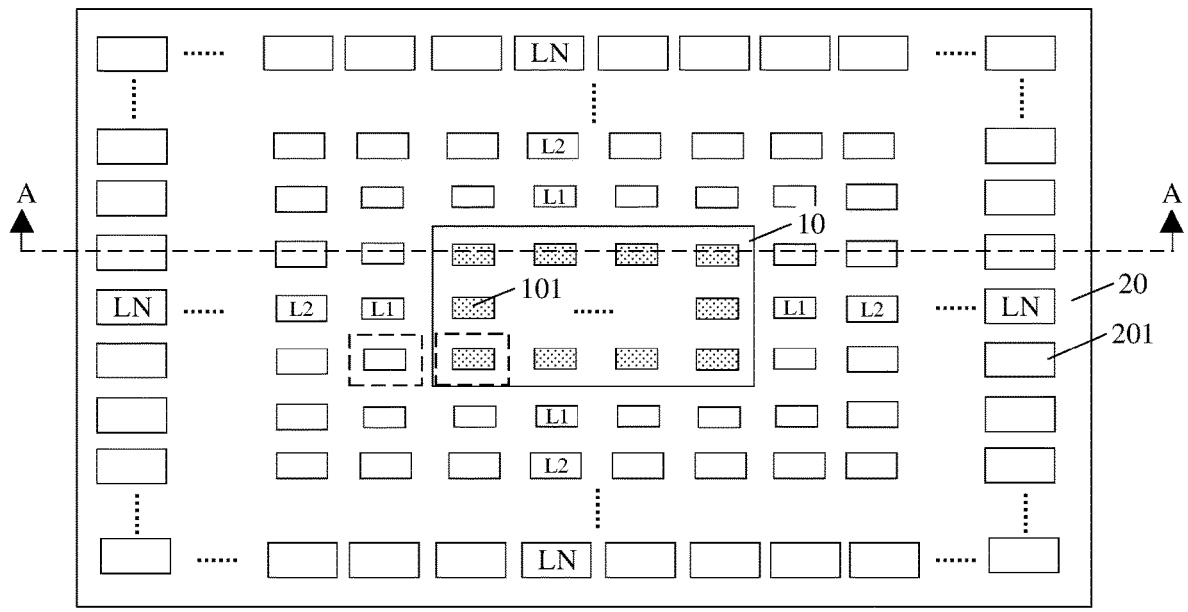
FIG. 1 is a schematically first plan diagram of a pixel definition layer of a display substrate according to an embodiment of the present disclosure.

In order to make objects, technical solutions and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, one of ordinary skill in the art can obtain other embodiment(s) without any creative work, which shall be within the scope of the disclosure.

Unless otherwise defined, all the technical and scientific terms used herein have the same meanings as commonly understood by one of ordinary skill in the art to which the present disclosure belongs. The terms "first," "second," or the like, which are used in the present application for disclosure, are not intended to indicate any sequence, amount or importance, but to distinguish various components. The terms "comprise," "comprising," "include," "including," or the like, are intended to specify that the elements or the objects stated before these terms encompass the elements or the objects and equivalents thereof listed after these terms, but do not preclude other elements or objects. The terms "connect/couple", "connected/coupled", or the like, are not limited to a physical connection or mechanical connection, but may also include an electrical connection, directly or indirectly. "On," "under," "right," "left" or the like are only used to indicate relative position relationship, and when the position of the object which is described is changed, the relative position relationship may be changed accordingly.

A pixel definition layer of a display substrate usually has a plurality of openings. When ink-jet printing is performed in these openings using an ink-jet printing process, an ink drying speed of an opening at an edge of the substrate tends to be quick, while the ink drying speed of the opening inside the substrate tends to be slow, leading to different ink drying speeds of the openings at the substrate edge and inside the substrate, such that the morphology of the dried ink in the openings at different positions is not uniform. For example, when an organic material is ink-jet printed in the opening to form the organic functional layer, the organic functional layers formed in the openings at different positions have non-uniform morphology (such as thickness), leading to non-uniform display brightness when the display substrate is operating, and seriously affects display effects of the display substrate.

In order to balance the ink drying speed of the openings at the edge of and inside the substrate, an assistant pixel may be arranged around the display pixel in the pixel definition layer, and the ink in the assistant pixel is the same as that in the display pixel, but the assistant pixel does not emit light when the display substrate displays.

At least one embodiment of the present disclosure provides a display substrate, having a display area and a peripheral area and including a pixel definition layer. The pixel definition layer including: a display pixel definition region and an assistant pixel definition region surrounding the display pixel definition region. The display pixel definition region includes a plurality of first pixel definition units; the assistant pixel definition region includes a plurality of second pixel definition units, and an opening area of each second pixel definition unit is greater than that of each first pixel definition unit. The display pixel definition region is in the display area, and the assistant pixel definition region is in the peripheral area. The plurality of first pixel definition units is configured to form display pixels, and the plurality of second pixel definition units is configured to form assistant pixels.

At least one embodiment of the present disclosure provides an ink-jet printing method using a pixel definition layer of the above-mentioned display substrate, including: performing ink-jet printing in openings of the first pixel definition unit and the second pixel definition unit.

At least one embodiment of the present disclosure provides a method for preparing a display substrate, the display substrate including a display area and a peripheral area, the method including: forming a pixel definition layer pixel, the definition layer including a display pixel definition region and an assistant pixel definition region surrounding the display pixel definition region. The display pixel definition region includes a plurality of first pixel definition units, and the assistant pixel definition region includes a plurality of second pixel definition units, and opening areas of at least part of the second pixel definition units are respectively greater than those of the first pixel definition units. The display pixel definition region is formed in the display area, the assistant pixel definition region is formed in the peripheral area, a plurality of first pixels is formed in the display area by a plurality of first pixel definition units, and a plurality of second pixels is formed in the peripheral area by a plurality of second pixel definition units.

At least one embodiment of the present disclosure provides a display device, including the above-mentioned display substrate.

The pixel definition layer in the display substrate according to at least one embodiment of the present disclosure may at least balance the ink drying speed in the opening of each first pixel definition unit by arranging fewer second pixel definition units, such that the morphology of the dried ink in the first pixel definition units is more uniform; additionally, that fewer second pixel definition units are arranged can reduce the space of the assistant pixel definition region, which can contribute to the design of a narrow bezel of the display substrate, simplify the fabrication process and save costs.

The display substrate and fabrication method thereof, the ink-jet printing method and the display device according to the present disclosure will be explained below by several embodiments.

At least one embodiment of the present disclosure provides a display substrate, which may be, for example, an array substrate of an organic light-emitting diode (OLED) display panel, and the display substrate includes a pixel definition layer. As shown in FIG. 1, the pixel definition layer includes a display pixel definition region 10 and an assistant pixel definition region 20 surrounding the display pixel definition region 10. The display pixel definition region 10 includes a plurality of first pixel definition units 101, the assistant pixel definition region 20 includes a plurality of second pixel definition units 201, and opening areas of at least part of the second pixel definition units 201 are respectively greater than those of the first pixel definition units 101.

Figure 4:
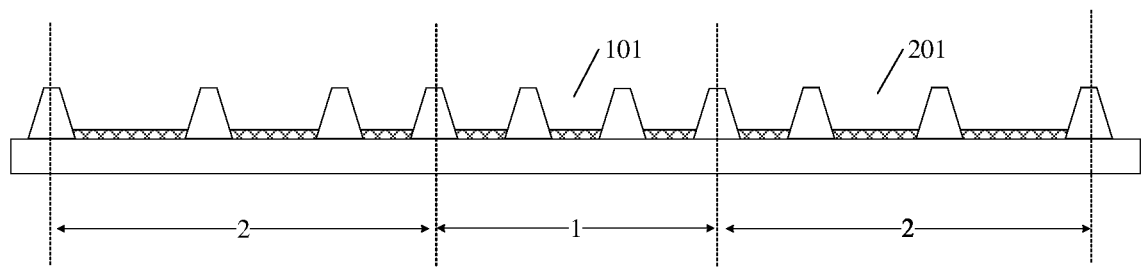
FIG. 4 is a schematically sectional diagram of a display panel according to an embodiment of the present disclosure.

For example, FIG. 4 is a schematically sectional diagram of a display substrate according to the present embodiment. As shown in FIG. 4, the display substrate has a display area 1 and a peripheral area 2, the display pixel definition region 10 is located in the display area 1, the assistant pixel definition region 20 is located in the peripheral area 2 (FIG. 4 is a sectional view of the pixel definition layer in FIG. 1 taken along A-A line, a sectional view of the pixel definition layer in a direction perpendicular to A-A line is similar to this sectional view along A-A, so, it is not provided in the present disclosure), and the plurality of first pixel definition units 101 is configured to form display pixels, and the plurality of second pixel definition units 201 is configured to form assistant pixels.

In the present embodiment, as shown in FIG. 1, the first pixel definition units and the second pixel definition units may be arranged in a matrix, for example. For example, the plurality of pixel definition units is formed in row(s) and column(s) and arranged in alignment. For example, the plurality of second pixel definition units 201 may be arranged layer by layer surrounding the display pixel definition region 10, and the display pixel definition region 10 is referred to an inner side, the opening areas of the second pixel definition units 201 increase gradually from an inner side to an outer side.

As shown in FIG. 1, in the present example, the plurality of second pixel definition units 201 surrounding the display pixel definition region 10, form L1 layer, L2 layer, . . . , LN layer successively, and from the L1 layer to the LN layer, the opening areas of the second pixel definition units 201 increase gradually. In the present embodiment, the plurality of second pixel definition units 201 may surround the display pixel definition region 10 to form 3-6 layers, for example, 4 or 5 layers.

In the present embodiment, since in the assistant pixel definition region 20, the opening areas of the second pixel definition units 201 from the L1 layer to the LN layer increase gradually, in the process of performing ink-jet printing using the pixel definition layer, the ink amount may be selected according to the opening area of the pixel definition unit. For example, the ink amount for ink-jet printing in the second pixel definition units and the first pixel definition units may be in direct proportion to the opening areas of the second pixel definition units and the first pixel definition units, respectively. In this way, instead of changing suddenly, a vapor pressure generated when the jet ink in the assistant pixel definition region is evaporated may change gradually from an outer layer to an inner layer in the assistant pixel definition region, realizing the technical effects of balancing the ink drying speed in the display pixel definition region 10.

As shown in FIG. 1, in an example of the present embodiment, the opening areas of the plurality of first pixel definition units 101 located in the display pixel definition region 10 may have a same size, and in the assistant pixel definition region 20, the opening areas of the second pixel definition units 201 of the L1 layer, which is the innermost layer, may be equal to the opening areas of the first pixel definition units 101, respectively.

Figure 2:
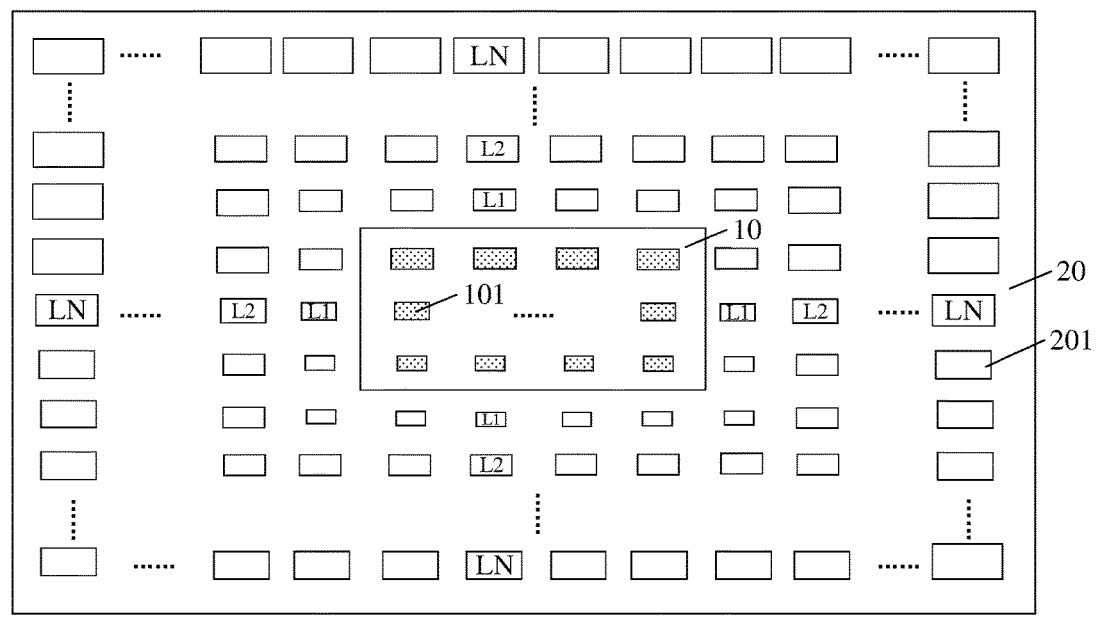
FIG. 2 is a schematically second plan diagram of a pixel definition layer of a display substrate according to an embodiment of the present disclosure.

As shown in FIG. 2, in another example of the present embodiment, the opening areas of the plurality of first pixel definition units 201 located in the display pixel definition region 10 may have different sizes. For example, the opening areas of a sub-pixel for displaying red and a sub-pixel for displaying green may be less than that of a sub-pixel for displaying blue; and in the assistant pixel definition area 20, the opening areas of the second pixel definition units 201 located in the same layer may also be different, for example. For example, the opening areas of the second pixel definition units 201 of the L1 layer which is the innermost layer, may be equal to those of the first pixel definition units 101 adjacent thereto, respectively.

In the present embodiment, when the opening areas of the second pixel definition units 201 of the L1 layer located in the assistant pixel definition region 20 are respectively equal to those of the first pixel definition units 101 adjacent thereto, in the process of performing ink-jet printing using the pixel definition layer, the ink amount for ink-jet printing in the second pixel definition units may be equal to that in the first pixel definition units adjacent thereto, which can reduce the sudden change in the vapor pressure due to ink evaporation at a boundary between the assistant pixel definition region and the display pixel definition region, avoiding the difference in the ink drying speeds between the first pixel definition units at the edge of the display pixel definition region and the first pixel definition units at the inner layer of the display pixel definition region due to the vapor pressure difference at the boundary.

Figure 3:
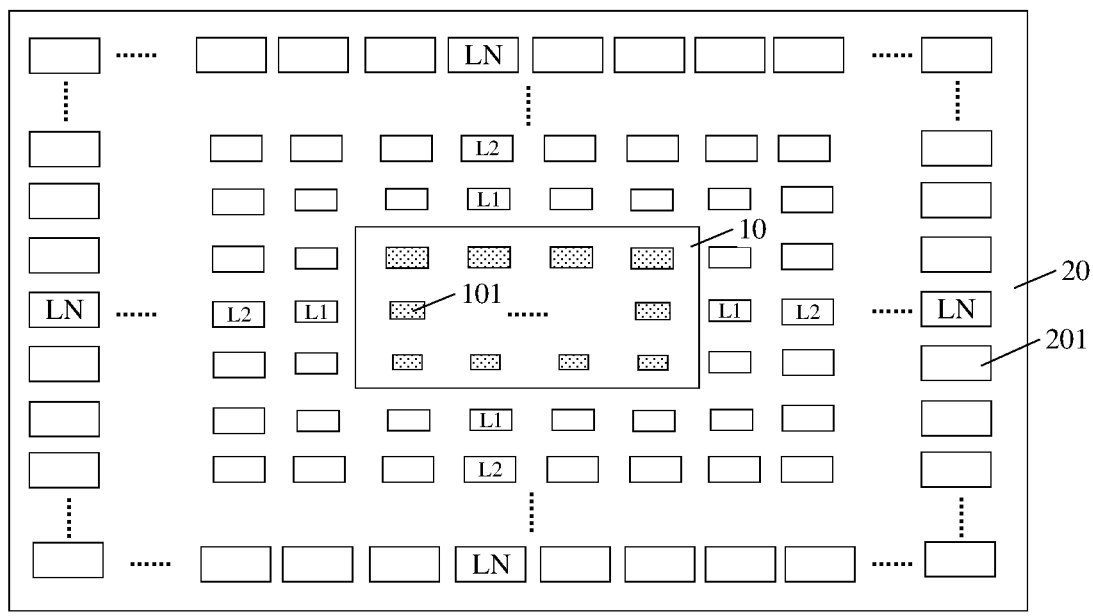
FIG. 3 is a schematically third plan diagram of a pixel definition layer of a display substrate according to an embodiment of the present disclosure.

As shown in FIG. 3, in an example of the present embodiment, when the opening areas of the plurality of first pixel definition units 101 located in the display pixel definition region have different sizes, in the assistant pixel definition region 20, the opening areas of the second pixel definition units 201 located in the same layer may also be the same. For example, the opening areas of the second pixel definition units 201 of the L1 layer, which is the innermost layer, are respectively equal to those of the first pixel definition units 101 with the largest areas in the display pixel definition region.

In an example of the present embodiment, in the assistant pixel definition region 20, an opening of a second pixel definition unit 201 located in a same layer and an opening of a first pixel definition unit 101 adjacent thereto have a same shape and become larger in a same proportion.

For example, as shown in FIG. 1, the opening areas of the plurality of first pixel definition units 101 located in the display pixel definition region 10 have the same size, and in the assistant pixel definition region 20, the opening areas of the second pixel definition units 201 located in the same layer have the same size, and from an inner layer to an outer layer, the ratios of the opening areas of the second pixel definition units 201 to the opening areas of the first pixel definition units 101 enlarge successively, and the extent of the increase may be the same, for example.

For example, when an aperture ratio of a first pixel definition unit 101 [the aperture ratio is a ratio of the opening area of the pixel definition unit to the area of the whole pixel definition unit occupied (in the drawings, the part enclosed by a dashed box), in the present embodiment, the first pixel definition units and the second pixel definition units have the same occupied area as a whole] is 30% and the second pixel definition units 201 form 5 layers surrounding the display pixel definition region 10, the aperture ratio of each second pixel definition unit 201 located in L1 layer may be 30%, for example, the aperture ratio of each second pixel definition unit 201 located in L2 layer may be 40%, for example, the aperture ratio of each second pixel definition unit 201 located in L3 layer may be 50%, for example, . . . , the aperture ratio of each second pixel definition unit 201 located in L5 layer may be 70%, for example. That is, the aperture ratios of the second pixel definition units 201 increase successively by 10% from the inner layer to the outer layer.

For example, when the aperture ratio of the first pixel definition units 101 is 40% and the second pixel definition units 201 forms 3 layers surrounding the display pixel definition region 10, the aperture ratio of the second pixel definition units 201 located in the L1 layer may be 50%, for example, the aperture ratio of the second pixel definition units 201 located in the L2 layer may be 60%, for example, and the aperture ratio of the second pixel definition units 201 located in the L3 layer may be 70%, for example. That is, the aperture ratios of the second pixel definition units 201 increase successively by 10% from the inner layer to the outer layer. In the present embodiment, the number of layers of the second pixel definition units located in the assistant pixel definition region is relatively small, and may be adjusted as needed.

For example, as shown in FIG. 2, the opening areas of the plurality of first pixel definition units 101 located in the display pixel definition region 10 have different sizes, and in the assistant pixel definition region 20, the opening areas of the second pixel definition units 201 located in the same layer also have different sizes, and the ratios of the opening areas of the second pixel definition units 201 located in the same layer to the opening areas of the first pixel definition units 101 closest to the second pixel definition units 201, i.e., the first pixel definition units 101 located at the outermost side of the display pixel definition region 10 in the same row or column as the second pixel definition units 201, are the same. From an inner layer to an outer layer, the ratios enlarge successively, and the extent of the increase may be the same, for example.

For example, when the first pixel definition units include three different sizes of openings, for example, the aperture ratios are 30%, 35% and 40%, respectively, and when the second pixel definition units 201 form 4 layers surrounding the display pixel definition region 10, in the L1 layer, the aperture ratios of the second pixel definition units 201 closest to the first pixel definition units 101 with the above-mentioned three openings having different sizes may be 30%, 35% and 40%, respectively, in the L2 layer, the aperture ratios of the corresponding second pixel definition units 201 may be for example, 35%, 40% and 45%, respectively, in the L3 layer, the aperture ratios of the corresponding second pixel definition units 201 may be for example, 40%, 45% and 50%, respectively, in the L4 layer, the aperture ratios of the corresponding second pixel definition units 201 may be for example, 45%, 50% and 60%, respectively. That is, the aperture ratios of the second pixel definition units 201 increase by 5% successively from the inner layer to the outer layer.

In an example of the present embodiment, in the case that the opening areas of the plurality of first pixel definition units 101 has different sizes, the opening areas of the second pixel definition units 201 located in the same layer may also have the same size. For example, the opening area of a second pixel definition unit 201 may be compared with the opening area of first pixel definition unit(s) 101 with the largest opening. From the inner layer to the outer layer, the ratios of the sizes of the opening areas of the second pixel definition units 201 to the size of the largest opening area of the first pixel definition unit(s) 101 increase successively, and the increase extent may be the same, for example. The increase way is substantially the same as that in the situation shown in FIG. 1, and is not repeated herein.

It should be noted that in the present embodiment, in the assistant pixel definition region 20, from the inner layer to the outer layer, the extent of the ratio of the opening area of each second pixel definition unit 201 to the opening area of a first pixel definition unit 101 closest thereto increasing successively may be selected according to the properties of the ink-jet printing material. The increase extent may be the same or different, and these material properties include a solvent evaporation rate, a solvent volatilization rate, or the like.

In the present embodiment, the first pixel definition units 101 and the second pixel definition units 201 may be rectangular, for example, and when a second pixel definition unit 201 enlarges with respect to a first pixel definition unit 101, its long side and short side are elongated in the same proportion as the long side and short side of the first pixel definition unit 101. That is, the first pixel definition units 101 and the second pixel definition units 201 have the same shape. The first pixel definition units 101 and the second pixel definition units 201 may have other appropriate shapes, such as parallelogram, trapezoid, or the like, and the shapes are not limited in the present embodiment.

In the present embodiment, for example, the organic functional layer of the display substrate may be formed by ink-jet printing an organic material in the openings of the first pixel definition units and the second pixel definition units of the pixel definition layer. The pixel definition layer may enable the morphology of the organic functional layer formed by ink-jet printing to be more uniform, for example, it enables the thickness and surface morphology of the organic functional layer to be more uniform. In the present embodiment, the organic functional layer may be an organic light emitting layer, an electron injection layer, a hole injection layer, an electron transfer layer, and a hole transfer layer, or the like, and not limited in the present embodiment.

In the present embodiment, the display substrate may further include other functional structures, such as a pixel drive circuit, an anode layer, a cathode layer, an insulating layer, or the like, which are not repeated in the present embodiment.

The pixel definition layer in the display substrate according to the present embodiment has a display pixel definition region and an assistant pixel definition region surrounding the display pixel definition region. The assistant pixel definition region can decrease the ink drying speeds in the first pixel definition units at the edge of the display pixel definition region, such that the ink drying speeds in the openings of the pixel definition units in the display pixel definition region are substantially consistent to each other, and the dried morphology of the ink is more uniform, for example, the film formation thickness of the ink is more uniform. In this way, the organic functional layer of the display substrate according to the present embodiment has more uniform morphology, which improves the display uniformity of the display substrate, and the display substrate has better display effects.

In the present embodiment, the opening areas of the second pixel definition units at least partially located in the assistant pixel definition region are greater than those of the first pixel definition units located in the display pixel definition region. In this way, when the ink-jet printing is performed in the second pixel definition units and the first pixel definition units to form a functional layer (for example, one or combination of the electron injection layer, the electron transfer layer, the organic light-emitting layer, the hole transfer layer, and the hole injection layer), the ink amount for ink-jet printing may be selected according to the opening area of a pixel definition unit. For example, more ink is jet in the second pixel definition unit, and less ink is jet in the first pixel definition unit. In this way, by arranging fewer second pixel definition units (for example, 3 layers), the pixel definition layer according to the present embodiment may at least balance the ink drying speed in the opening of each first pixel definition unit, such that the morphology of the dried ink in the first pixel definition units is more uniform (if the opening area of each second pixel definition unit of the assistant pixel definition region is the same as that of each first pixel definition unit of the display pixel definition region, particularly in the case that the functional layer to be formed in the pixel opening has a relatively large thickness, more than ten layers of second pixel definition units are arranged to balance the ink drying speed in the opening of each first pixel definition unit); in addition, fewer second pixel definition units arranged can reduce the space occupied by the assistant pixel definition region, which can contribute to the design of a narrow bezel of the display substrate, simplify the fabrication process, and save costs.

At least one embodiment of the present disclosure provides an ink-jet printing method using the pixel definition layer in the display substrate according to the above-mentioned embodiments. The method may be used for forming the array substrate of the OLED display panel, and the method includes performing ink-jet printing in the openings of the first pixel definition units and the second pixel definition units, and forming the required functional layer.

For example, in the present embodiment, in ink-jet printing, the ink amount for ink printing in the openings of the second pixel definition units may be respectively greater than that in the openings of the first pixel definition units. For example, the ink amounts for ink-jet printing in the second pixel definition units and the first pixel definition units may be in direct proportion respectively to the sizes of the opening areas of the second pixel definition units and the first pixel definition units. In this way, by ink-jetting different ink amounts in the pixel definition units with different opening areas at different positions, when the ink is dried, from the outer layer to the inner layer of the assistant pixel definition region, the difference in vapor pressure due to the ink evaporation above the assistant pixel definition region decreases gradually without a sudden change, so that the vapor pressures at least above the first pixel definition units in the display pixel definition region are nearly same or are the same, to allow the ink drying speed of various first pixel definition units to be the same, and the morphology of the dried ink to be uniform.

For example, when the assistant pixel definition region is located in the innermost layer, that is, when the opening area of each second pixel definition unit of the L1 layer is equal to the opening area of the first pixel definition unit, adjacent to the second pixel definition unit, in the display pixel definition region, the ink amount for ink-jet printing in the second pixel definition unit is equal to that of the first pixel definition unit adjacent to the second pixel definition unit. In this way, the sudden change in the vapor pressure at the boundary between the assistant pixel definition region and the display pixel definition region may be reduced, avoiding the difference in the ink drying speed between the first pixel definition units at the edge of the display pixel definition region and the first pixel definition units at the inner layer of the display pixel definition region due to the vapor pressure difference at the boundary.

In the present embodiment, the ink amount for ink-jet printing in the opening of the second pixel definition units may increase successively from the inner layer to the outer layer, and the increase extent may be the same. For example, when the first pixel definition units and the second pixel definition units are rectangular, and the second pixel definition units enlarge with respect to the first pixel definition units, respectively, it is possible to keep the first pixel definition units and the second pixel definition units having the same shape, respectively, i.e., the long and short sides of the second pixel definition units located in the same layer are elongated with respect to the long and short sides of the first pixel definition units in a same proportion; and in the assistant pixel definition region, the increase extent is the same from the inner layer to the outer layer; at this point, when the ink-jet printing is performed on the first pixel definition units and the second pixel definition units which are located at different positions and have the same shape but different sizes, the shape of each pixel definition unit is the same, and in the assistant pixel definition region, from the inner layer to the outer layer, the increase extent of the ink amount for ink-jet printing in the pixel definition units is the same. In this way, the vapor pressure due to the ink evaporation above each pixel definition unit may be adjusted better, such that the change in the vapor pressure is more uniform, realizing nearly same or same vapor pressure above at least each first pixel definition unit in the display pixel definition region, such that the ink drying speed in each pixel definition unit is basically the same, and the morphology of the dried ink is more uniform.

The ink-jet printing method according to the present embodiment can select the ink amount for ink-jet printing according to the position of pixel definition units and their opening areas, so, it can adjust and control the ink drying speed in the second pixel definition units at the edge at different levels, such that the ink drying speeds at least in the first pixel definition units located in the display pixel definition region are substantially the same, and the morphology of the dried ink is more uniform.

Figure 5A:
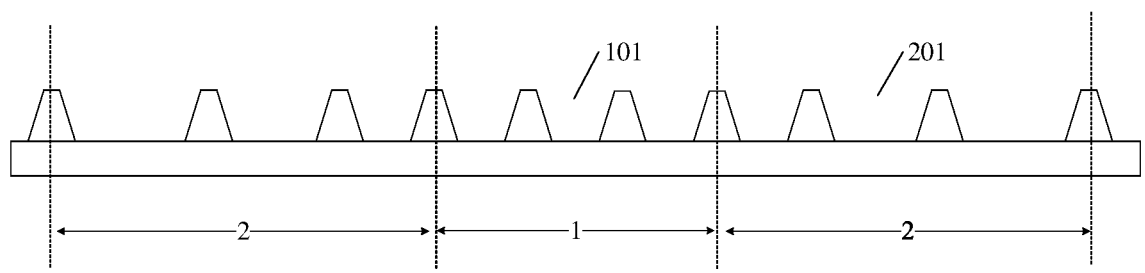
FIGS. 5A and 5B are sectional views of the display substrate during a fabrication process according to an embodiment of the present disclosure.

At least one embodiment of the present disclosure provides a method for preparing a display substrate, as shown in FIG. 5A, the display substrate includes a display area 1 and a peripheral area 2. The method includes forming a pixel definition layer (FIG. 5A is the sectional view of the pixel definition layer in FIG. 1 taken along the A-A line). The pixel definition layer includes a display pixel definition region and an assistant pixel definition region surrounding the display pixel definition region. The display pixel definition region includes a plurality of first pixel definition units 101, the assistant pixel definition region 20 includes a plurality of second pixel definition units 201, and opening areas of at least part of the second pixel definition units 201 are respectively greater than those of the first pixel definition units 101. The display pixel definition region and the assistant pixel definition region of the pixel definition layer are formed in the display area 1 and the peripheral area 2 of the display substrate, respectively; and a plurality of first pixels is formed in the display area 1 by a plurality of first pixel definition units 101, and a plurality of second pixels is formed in the peripheral area by a plurality of second pixel definition units 201.

In the present embodiment, the first pixels formed in the display area 1 are display pixels, for displaying images to be displayed by the organic light emitting display substrate. For example, the pixels are those pixels displaying red, green, blue or white; the second pixels formed in the peripheral area 2 are assistant pixels, for assisting the formation of the display pixels, such that the morphology of each functional layer formed in the display pixel is more uniform.

Figure 5B:
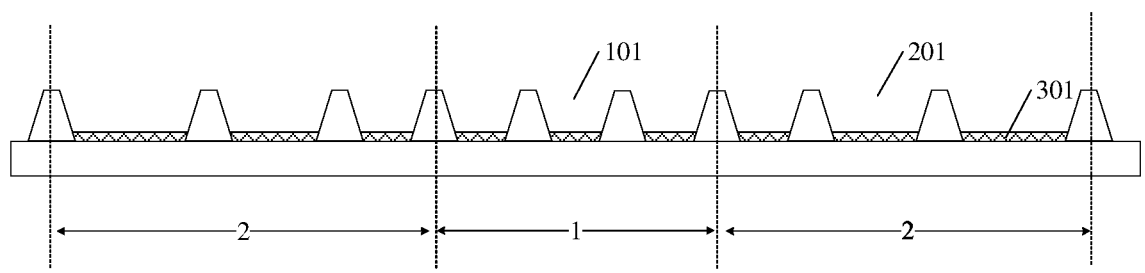

In the present embodiment, as shown in FIG. 5B, the formation of the plurality of first pixels and the plurality of second pixels may include ink-jet printing organic materials in the openings of the first pixel definition units 101 and the second pixel definition units 201 to form an organic functional layer 301. The organic functional layer 301 may be at least one of an organic light-emitting layer, an electron injection layer, a hole injection layer, an electron transfer layer, and a hole transfer layer, and it is not limited in the present embodiment.

In an example of the present embodiment, when the light emitting layer of the formed display substrate is a light-emitting layer which can emit white light, the opening areas of the plurality of first pixel definition units 101 formed in the display area 10 may have the same size, i.e., the pixel definition layer as shown in FIG. 1 is formed. In this case, the display substrate may realize the full-color display substrate by the white light-emitting layer used with a color filter.

In another example of the present embodiment, when the light emitting layer of the formed organic light-emitting display substrate is a light-emitting layer which can emit color light, for example, red light, green light and blue light, the opening areas of the plurality of first pixel definition units 101 formed in the display area 10 may have different sizes, for example, the pixel definition layer as shown in FIG. 2 or 3 is formed. In this case, the first pixel definition units 101 may include three pixel definition units with different sizes of openings, and the pixel definition units may correspond to a blue pixel definition unit, a green pixel definition unit and a red pixel definition unit from large to small. In this way, the organic material with the corresponding color is ink-jet printed in the above-mentioned pixel definition units, forming a blue light-emitting layer, a green light-emitting layer and a red light-emitting layer, respectively. The light emitting layers of the organic light-emitting display substrate may emit color light directly after energized.

In the present embodiment, for example, the amounts of ink-jet printed organic materials in the openings of the second pixel definition units and the first pixel definition units may be selected according to the opening areas of the second pixel definition units and the first pixel definition units.

For example, in an example of the present embodiment, the amounts of ink-jet printed organic materials in the openings of the second pixel definition units and the first pixel definition units are in direct proportion to the opening areas of the second pixel definition units and the first pixel definition units, respectively. In this way, from the outer layer to the inner layer, the amounts of organic material ink-jet printed in the second pixel definition units decrease gradually. In this way, the drying speed of the organic material in the second pixel definition units at the edge may be decreased variously, such that the drying speeds of the organic material ink-jet printed in pixel definition units are the same substantially, and the organic material ink-jet printed in the openings of the pixel definition units have more uniform morphology after dried, or the organic material ink-jet printed at least in the openings of the first pixel definition units have more uniform morphology after dried. In this way, in the first pixel definition units, a more uniform organic functional layer is formed, for example, the organic functional layer with more uniform thickness and surface morphology is formed. The organic light emitting display substrate prepared by the method according to the present embodiment has better display uniformity, and the obtained display device has better display effects.

In addition, in the present embodiment, the opening areas of the second pixel definition units formed in the peripheral area are respectively greater than those of the first pixel definition units formed in the display area, the drying speed of the organic material in the opening of each first pixel definition unit can be at least balanced with a small number of second pixel definition units. It is possible that even more fewer second pixels located in the peripheral area formed by the method for preparing the organic light emitting display substrate according to the present embodiment, reducing the peripheral area of the formed display substrate, and realizing the design of a narrow bezel of the display substrate.

Figure 6:
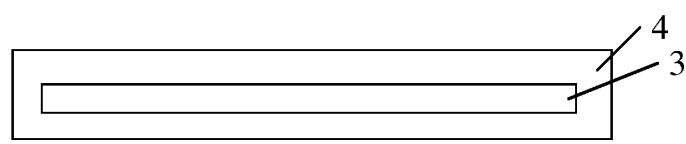
FIG. 6 is a schematic diagram of a display panel according to an embodiment of the present disclosure.

At least one embodiment of the present disclosure provides a display panel, as shown in FIG. 6, including the above-mentioned display substrate 3. The display panel 4 may be an organic light-emitting display panel. The display panel 4 has excellent display uniformity, and has a narrow bezel, which can realize a large-screen display.

Figure 7:
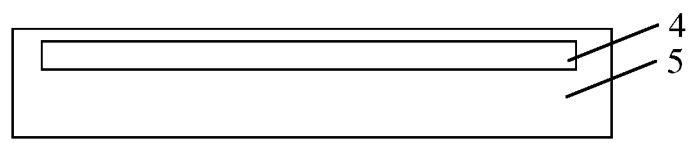
FIG. 7 is a schematic diagram of a display device according to an embodiment of the present disclosure.

At least one embodiment of the present disclosure also provides a display device, as shown in FIG. 7, the display device includes the above-mentioned display panel 4. The display device 5 may be any electronic product with a display function, such as a mobile phone, a computer, a TV, an electronic book, or the like, and is not limited in the present embodiment.

The following points need to be noted:

(1) The accompanying drawings involve only structures in connection with the embodiments of the present disclosure, and other structure(s) can be referred to common design(s).

(2) For clarity, in the accompanying drawings of the embodiments of the present disclosure, the thickness of layers or regions is enlarged or reduced. That is, the accompanying drawings are not drawn according to actual scales. It is to be understood that, when a component or element, such as layer, film, area, substrate, or the like is referred to be "on" or "under" another component or element, it may be directly on or under the another component or element, or a component or an element is interposed therebetween.

(3) Without conflict, the embodiments of the present disclosure and the features in the embodiments can be combined with each other to obtain new embodiments.

The descriptions above are only specific embodiments of the present invention, but the scope of the present disclosure is not intended to be limited thereto. The scope of the present disclosure is defined by the claims.

What is claimed is:

1. A display substrate, comprising a display area, a peripheral area, and a pixel definition layer;
wherein the pixel definition layer comprises: a display pixel definition region and an assistant pixel definition region surrounding the display pixel definition region, the display pixel definition region comprising a plurality of first pixel definition units, the assistant pixel definition region comprising a plurality of second pixel definition units, the plurality of second pixel definition units is arranged layer by layer surrounding the display pixel definition region, a proximal side of display pixel definition region is an inner side, an opening area of each second pixel definition unit being not less than that of each first pixel definition unit, the display pixel definition region being in the display area, the assistant pixel definition region being in the peripheral area, the plurality of first pixel definition units being configured to form display pixels, and the plurality of second pixel definition units being configured to form assistant pixels;
wherein the opening areas of the plurality of first pixel definition units located in the display pixel definition region are same, the opening areas of the plurality of second pixel definition units located in the assistant pixel definition region are different, the opening areas of the second pixel definition units of an L1 layer, which is an innermost layer, are equal to the opening areas of the first pixel definition units; or
the opening areas of the plurality of first pixel definition units located in the display pixel definition region are different, and in the assistant pixel definition region, the opening areas of the second pixel definition units located in a same layer are same, so that the opening areas of the second pixel definition unit of the L1 layer that is the innermost layer are respectively equal to those of the first pixel definition units with largest areas in the display pixel definition region; or
the opening areas of the plurality of first pixel definition units located in the display pixel definition region are different, and in the assistant pixel definition region, the opening areas of the second pixel definition units located in different layers are different and increase gradually from an inner layer to an outer layer, and ratios of the opening areas of the second pixel definition units located in a same layer to the opening areas of the first pixel definition units closest to the second pixel definition units, which include the first pixel definition units located at an outermost side of the display pixel definition region in a same row or column as the second pixel definition units, are same, and the ratios of the opening areas of the second pixel definition units in the peripheral area to the opening areas of the first pixel definition units closest to the second pixel definition units in the display area enlarge successively from the inner layer to the outer layer of the second pixel definition units.

2. The display substrate according to claim 1, wherein the assistant pixel definition region comprises 3-6 layers of the second pixel definition units.

3. The display substrate according to claim 1, wherein the openings of the second pixel definition units located in a same layer and the openings of the first pixel definition units adjacent thereto have a same shape and become larger in a same proportion.

4. The display substrate according to claim 1, wherein the first pixel definition units and the second pixel definition units are arranged in a matrix.

5. An ink-jet printing method using the pixel definition layer of the display substrate according to claim 1, comprising:
performing ink-jet printing in the openings of the first pixel definition units and the second pixel definition units.

6. The ink-jet printing method according to claim 5, wherein an ink amount for ink-jet printing in each opening of the second pixel definition units is not less than an ink amount for ink-jet printing in a corresponding opening of the first pixel definition units.

7. The ink-jet printing method according to claim 5, wherein the ink amounts for ink-jet printing in each second pixel definition unit and each first pixel definition unit are in direct proportion to the sizes of the opening areas of the each second pixel definition unit and the each first pixel definition unit.

8. A method for preparing a display substrate, the display substrate comprising a display area and a peripheral area, the method comprising:
forming a pixel definition layer, the pixel definition layer comprising: a display pixel definition region and an assistant pixel definition region surrounding the display pixel definition region; wherein the display pixel definition region comprises a plurality of first pixel definition units; the assistant pixel definition region comprises a plurality of second pixel definition units, the plurality of second pixel definition units are arranged layer by layer surrounding the display pixel definition region, a proximal side of display pixel definition region is an inner side, and opening areas of the second pixel definition units are respectively not less than those of the first pixel definition units, respectively;
forming the display pixel definition region in the display area, forming the assistant pixel definition region in the peripheral area;
forming a plurality of first pixels in the display area by a plurality of first pixel definition units, and
forming a plurality of second pixels in the peripheral area by a plurality of second pixel definition units;
wherein the opening areas of the plurality of first pixel definition units located in the display pixel definition region are same, the opening areas of the plurality of second pixel definition units located in the assistant pixel definition region are different, the opening areas of the second pixel definition units of the L1 layer, which is an innermost layer, are equal to the opening areas of the first pixel definition units; or
the opening areas of the plurality of first pixel definition units located in the display pixel definition region are different, and in the assistant pixel definition region, the opening areas of the second pixel definition units located in a same layer are same, so that the opening areas of the second pixel definition units of the L1 layer that is the innermost layer are respectively equal to those of the first pixel definition units with largest areas in the display pixel definition region; or
the opening areas of the plurality of first pixel definition units located in the display pixel definition region are different, and in the assistant pixel definition region, the opening areas of the second pixel definition units located in different layers are different and increase gradually from an inner layer to an outer layer, and ratios of the opening areas of the second pixel definition units located in a same layer to the opening areas of the first pixel definition units closest to the second pixel definition units, which include the first pixel definition units located at an outermost side of the display pixel definition region in a same row or column as the second pixel definition units, are same, and the ratios of the opening areas of the second pixel definition units in the peripheral area to the opening areas of the first pixel definition units closest to the second pixel definition units in the display area enlarge successively from the inner layer to the outer layer of the second pixel definition units.

9. The method for preparing a display substrate according to claim 8, wherein forming of the plurality of first pixels and the plurality of second pixels comprises:
ink-jet printing organic materials in the openings of the first pixel definition units and the second pixel definition units to form an organic functional layer.

10. The method for preparing a display substrate according to claim 9, wherein amounts of ink-jet printed organic materials in the openings of the second pixel definition units and the first pixel definition units are in direct proportion to the opening areas of the second pixel definition units and the first pixel definition units, respectively.

11. The method for preparing a display substrate according to claim 9, wherein the organic functional layer comprises at least one of an organic light-emitting layer, an electron injection layer, a hole injection layer, an electron transfer layer and a hole transfer layer.

12. A display device, comprising a display substrate, wherein the display substrate comprises: a display area, a peripheral area, and a pixel definition layer;
wherein the pixel definition layer comprises: a display pixel definition region and an assistant pixel definition region surrounding the display pixel definition region, the display pixel definition region comprising a plurality of first pixel definition units, the assistant pixel definition region comprising a plurality of second pixel definition units, an opening area of each second pixel definition unit being not less than that of each first pixel definition unit, the display pixel definition region being in the display area, the assistant pixel definition region being in the peripheral area, the plurality of first pixel definition units being configured to form display pixels, and the plurality of second pixel definition units being configured to form assistant pixels;
wherein the opening areas of the plurality of first pixel definition units located in the display pixel definition region are same, the opening areas of the plurality of second pixel definition units located in the assistant pixel definition region are different, the opening areas of the second pixel definition units of an L1 layer, which is an innermost layer, are equal to the opening areas of the first pixel definition units; or
the opening areas of the plurality of first pixel definition units located in the display pixel definition region are different, in the assistant pixel definition region, the opening areas of the second pixel definition units located in a same layer are same, so that the opening areas of the second pixel definition unit of the L1 layer that is the innermost layer are respectively equal to those of the first pixel definition units with largest areas in the display pixel definition region; or
the opening areas of the plurality of first pixel definition units located in the display pixel definition region are different, and in the assistant pixel definition region, the opening areas of the second pixel definition units located different layers are different and increase gradually from an inner layer to an outer layer, and ratios of the opening areas of the second pixel definition units located in a same layer to the opening areas of the first pixel definition units closest to the second pixel definition units, which include the first pixel definition units located at an outermost side of the display pixel definition region in a same row or column as the second pixel definition units, are same, and the ratios of the opening areas of the second pixel definition units in the peripheral area to the opening areas of the first pixel definition units closest to the second pixel definition units in the display area enlarge successively from the inner layer to the outer layer of the second pixel definition units.

13. The display device according to claim 12, wherein the assistant pixel definition region comprises 3-6 layers of the second pixel definition units.

14. The display device according to claim 13, wherein the openings of the second pixel definition units located in a same layer and the openings of the first pixel definition units adjacent thereto have a same shape and become larger in a same proportion.

15. The display device according to claim 14, wherein the first pixel definition units and the second pixel definition units are arranged in a matrix.

16. The method for preparing a display substrate according to claim 10, wherein the organic functional layer comprises at least one of an organic light-emitting layer, an electron injection layer, a hole injection layer, an electron transfer layer and a hole transfer layer.

* * * * *